(12) United States Patent
Audy (10) Patent No.: US 7,187,226 B2
(45) Date of Patent: Mar. 6, 2007

(54) ANTI-CROSS CONDUCTION DRIVE CONTROL CIRCUIT AND METHOD

(75) Inventor: Jonathan M. Audy, Los Gatos, CA (US)

(73) Assignee: Analog Devices, Inc., Norwood, MA (US)

( * ) Notice: Subject to any disclaimer, the term of this patent is extended or adjusted under 35 U.S.C. 154(b) by 142 days.

(21) Appl. No.: 11/035,284

(22) Filed: Jan. 12, 2005

(65) Prior Publication Data

US 2006/0001459 A1    Jan. 5, 2006

Related U.S. Application Data

(60) Provisional application No. 60/585,397, filed on Jul. 1, 2004.

(51) Int. Cl.
*H03K 17/16* (2006.01)
*H03K 17/26* (2006.01)

(52) U.S. Cl. .................. 327/387; 327/590; 327/399; 326/27; 326/83

(58) Field of Classification Search .................. None
See application file for complete search history.

(56) References Cited

U.S. PATENT DOCUMENTS 5,097,149 A * 3/1992 Lee ........................... 326/87

| | | | |
|---|---|---|---|
| 5,155,398 A | 10/1992 | Mikuni et al. | 327/436 |
| 5,365,118 A | 11/1994 | Wilcox | 327/109 |
| 5,408,150 A | 4/1995 | Wilcox | 327/108 |
| 5,541,541 A | 7/1996 | Salamina et al. | 327/108 |
| 6,307,409 B1 | 10/2001 | Wrathall | 327/112 |
| 6,448,838 B1 | 9/2002 | Heim et al. | 327/365 |
| 6,958,592 B2 * | 10/2005 | Chapuis | 323/246 |
| 2003/0067728 A1 | 4/2003 | Feldtkeller | |

FOREIGN PATENT DOCUMENTS

| DE | 4032014 | 5/1991 |
|---|---|---|
| EP | 0798858 | 10/1997 |

* cited by examiner

*Primary Examiner*—Timothy P. Callahan
*Assistant Examiner*—Terry L. Englund
(74) *Attorney, Agent, or Firm*—Koppel, Patrick & Heybl (57) ABSTRACT

An anti-cross conduction driver control circuit and method prevent the occurrence of race conditions and avoid cross-conduction between series-connected power devices, typically MOSFETs, controlled in accordance with the present invention. Individual state machines are connected across the inputs and outputs of each power device driver, and are arranged to accurately determine when the driver has completed a task requested of it. Each state machine produces a "lockout" signal based on driver status, which is used to inhibit the operation of the opposite driver under prescribed conditions, and to thereby prevent cross-conduction between the series-connected power devices.

18 Claims, 6 Drawing Sheets

ANTI-CROSS CONDUCTION DRIVE CONTROL CIRCUIT AND METHOD

This application claims the benefit of provisional patent application No. 60/585,397 to Audy, filed Jul. 1, 2004.

BACKGROUND OF THE INVENTION

1. Field of the Invention

This invention relates to the field of power switch driver circuits, and particularly to driver circuits designed to prevent cross conduction between a pair of series-connected power switches.

2. Description of the Related Art

Many circuits include an output stage consisting of two power switches connected in series, with each switch conducting a respective current to or from a common node which serves as the stage's output. The switches are typically connected between a supply voltage and ground; as such, it is important that only one switch be closed at a time, to prevent "shoot-through" currents from flowing through both switches.

Figure 1:
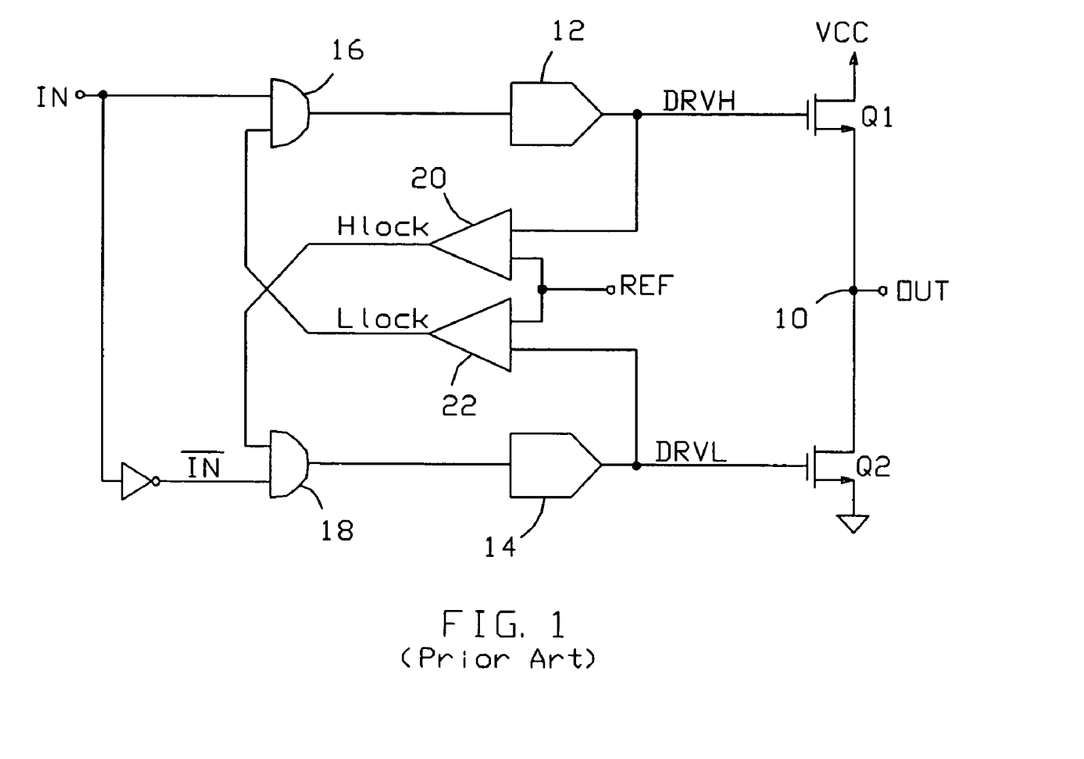
FIG. 1 is a schematic diagram illustrating a known anti-cross conduction driver control circuit.

A number of "anti-cross conduction" techniques have been developed to ensure that both switches are not closed at the same time. A typical approach is shown in FIG. 1. A pair of power switches, here first and second field-effect transistors (FETs) Q1 and Q2, have their current circuits connected in series between a supply voltage VCC and ground. "High-side" transistor Q1 and "low-side" transistor Q2 are connected together at a common node 10, which provides the stage's output OUT. The transistors are controlled with respective control signals DRVH and DRVL provided by high-side and low-side driver circuits 12 and 14, respectively. Q1 conducts a current to node 10 when driven on by DRVH, and Q2 conducts a current from node 10 when driven on by DRVL. An input signal IN is provided to control the switches: when "high", Q1 is to be driven on (and Q2 is to be off), and when "low", Q2 is to be driven on (and Q1 is to be off).

To prevent both Q1 and Q2 from being on simultaneously, the driver circuit may employ an anti-cross conduction technique. This typically involves using drive signals DRVH and DRVL as feedback signals that serve as "lockout" signals for the opposite driver. For example, in FIG. 1, the input signal IN and its complement $\overline{\text{IN}}$ are provided to respective logic gates 16 and 18, along with respective lockout signals Llock and Hlock; the outputs of gates 16 and 18 are provided to driver circuits 12 and 14, respectively. Lockout signals Hlock and Llock are provided by respective comparators 20 and 22: comparator 20 receives DRVH and a reference voltage REF at respective inputs, and its output Hlock goes low when DRVH>REF. Similarly, comparator 22 receives DRVL and REF at respective inputs, and its output Llock goes low when DRVL>REF. In this way, when DRVH is high and Q1 is on, Hlock is low and $\overline{\text{IN}}$ is locked out by gate 18, which keeps DRVL low and Q2 off. When DRVL is high and Q2 is on, Llock is low and IN is locked out, keeping DRVH low and Q1 off.

This approach works well for most circumstances, but may be unreliable for input events having intervals shorter than the settling time of the feedback loop. A narrow pulse on IN, for example, may begin to propagate through driver circuit 12, and then propagate through driver circuit 14 when the pulse falls. If the propagation delay through driver circuit 12 is longer than the pulse width, a race condition may arise that results in both Q1 and Q2 being on at the same time. This is referred to as "cross-conduction", which results in shoot-through currents that consume excessive current and can damage the power devices.

SUMMARY OF THE INVENTION

An anti-cross conduction driver control circuit and method are presented which overcome the problems noted above; the present invention prevents the occurrence of race conditions and therefore avoids cross-conduction between series-connected power devices controlled in accordance with the present invention.

The present invention employs individual state machines connected across the inputs and outputs of each power device driver. The state machines are arranged to assess the true status of each driver, as all the information entering and exiting the driver is monitored. By monitoring each driver's inputs and outputs, the state machines can accurately indicate when the driver has completed a task requested of it. For example, when a command to turn on and off one of the power devices is provided to the switch's driver, the state machine ensures that this task is completed before any new tasks are executed.

The present invention is suitably employed to drive two series-connected power devices, typically FETs, which are controlled by respective driver circuits. Each of the state machines receives the inputs and outputs of one of the driver circuits, and produces a "lockout" signal in response. The lockout signal is used to inhibit the operation of the opposite driver under prescribed conditions.

A state machine's lockout signal has "lockout" and "non-lockout" states. A basic state machine in accordance with the present invention is arranged to toggle its lockout signal from its "non-lockout" to its "lockout" state when the driver circuit across which it is connected receives a "turn-on" request signal intended to close the driver's power switch. The lockout signal is connected to inhibit the operation of the opposite driver when in its "lockout" state. Then, when the driver circuit receives a "turn-off" request signal, the driver output signal toggles from "on" to "off"; if the request signal remains in its "turn-off" state throughout the driver's turn-off period, the state machine sets its lockout signal to its non-lockout state, thereby allowing the opposite driver to be driven. When so arranged, the first and second driver circuit outputs—and thus their corresponding power switches—are prevented from being in their "on" states simultaneously.

Further features and advantages of the invention will be apparent to those skilled in the art from the following detailed description, taken together with the accompanying drawings.

DETAILED DESCRIPTION OF THE INVENTION

The present invention is an anti-cross conduction driver control circuit and method which provides reliable prevention of shoot-through currents, regardless of the width of the input pulse or the particular characteristics (including propagation delay) of the driver circuits.

Figure 2:
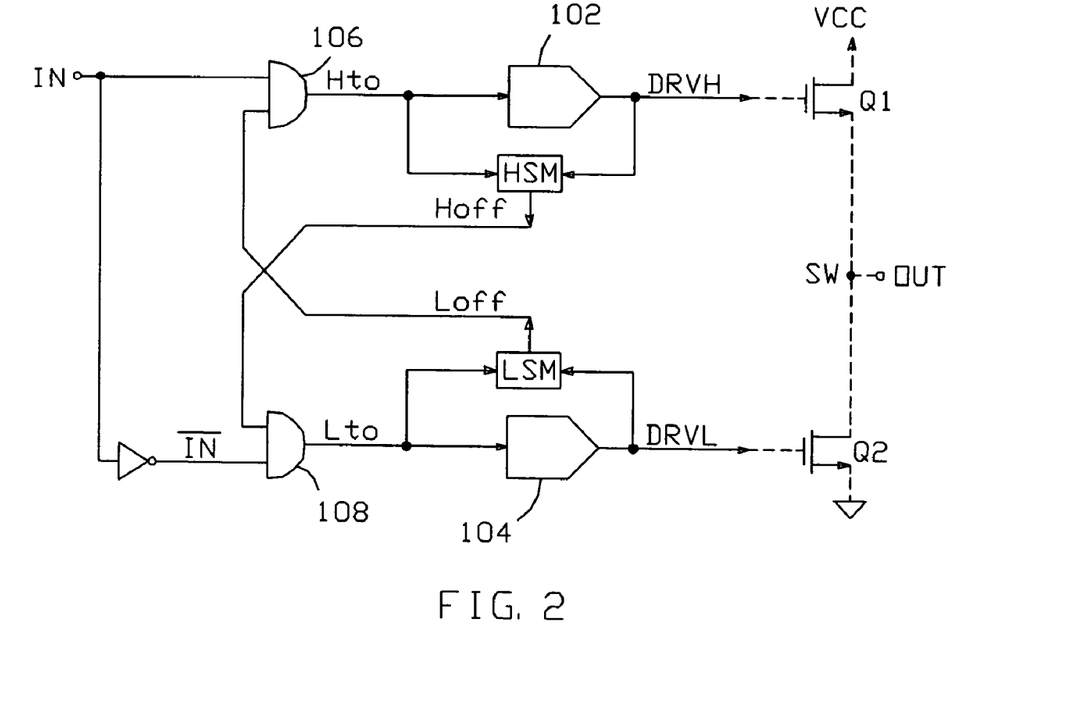
FIG. 2 is a schematic diagram illustrating an anti-cross conduction driver control circuit in accordance with the present invention.

The basic principles of the invention are illustrated in FIG. 2. The circuit is suitably employed to drive two power devices which are connected in series between a first supply voltage (VCC) and a second supply voltage (which may include ground). In FIG. 2, the power devices are shown as FETs (Q1 and Q2), though bipolar transistors or other types of switching devices might also be driven. The power devices are connected together at a switching node SW, which typically provides a final output (OUT).

The power devices controlled by the present driver control circuit are driven with respective driver circuits 102 and 104, which are typically referred to as "high-side" and "low-side" drivers, respectively. High-side driver 102 receives an input signal Hto (to=turn on) and produces an output DRVH, and low-side driver 104 receives an input signal Lto and produces an output DRVL. Each driver circuit buffers its input signal, providing gain, isolation, and/or level shifting as required by a particular application.

Signals Hto and Lto are referred to herein as "driver turn-on" signals. Each has an "on" state and an "off state". When one of the driver turn-on signals toggles from its "off" to its "on" state, its corresponding driver circuit output also toggles from "off" to "on"—after the turn-on signal has propagated through the driver circuit. As used herein, when a driver circuit output is "on", its corresponding power device is driven on such that it conducts current. Depending on the particular application, "on" and "off" states might correspond to "high" and "low" logic levels, respectively, or to "low" and "high" logic levels, respectively. In the exemplary embodiment shown in FIG. 2, the "on" and "off" states correspond to "high" and "low" logic levels, respectively.

A logic gate 106 receives an input signal IN at one of its inputs and a "lockout" signal "Loff" at its other input, and provides driver turn-on signal Hto at its output. Similarly, a logic gate 108 receives an input signal $\overline{\text{IN}}$ at one of its inputs and a "lockout" signal "Hoff" at its other input, and provides driver turn-on signal Lto at its output.

Input signals IN and $\overline{\text{IN}}$ are normally complementary—i.e., they may or may not be race-free—and each has "on" and "off" states. In operation, when IN toggles from "off" to "on", $\overline{\text{IN}}$ toggles from "on" to "off", Q1 is to be driven on, and Q2 is to be driven off. When IN is "off", $\overline{\text{IN}}$ and Q2 are "on", and IN and Q1 are off.

Cross-conduction is prevented with the use of lockout signals Loff and Hoff, each of which has "lockout" and "non-lockout" states. When connected to AND gates 106 and 108 as shown in the exemplary embodiment shown in FIG. 2, the "lockout" state corresponds to a logic "0"—such that the signal at the gate's other input cannot be passed on to the gate's output, and the "non-lockout" corresponds to a logic "1", such that the gate's other input is conveyed to the gate's output. For example, when Loff is a "0", signals Hto and thus DRVH are also "0" and Q1 is off—regardless of the state of input signal IN; i.e., operation of the high-side power device is "locked-out" when Loff is in its lockout state.

Lockout signals Hoff and Loff are provided by state machines HSM and LSM, respectively. Each state machine is connected across the inputs and outputs of a corresponding driver circuit: HSM across driver circuit 102 and LSM across driver circuit 104. This arrangement enables all information entering or exiting each driver circuit to be monitored. Then, by properly configuring the state machine, appropriate action can be taken for any combination of events.

The actions of the Hto and Lto inputs to driver circuits 102 and 104, respectively, can be considered as requests to turn on, or turn off, the corresponding driver and its power device. In practice, the driver sometimes successfully completes these tasks, and sometimes does not—such as in the case of very narrow input pulses or when external fault conditions create a short across the power switch. The state machines are arranged to respond in a desired and predictable manner when tasks do not complete successfully. Every permutation of driver input and output elicits a defined response from the state machines. By monitoring each driver's inputs and outputs, the state machines can accurately indicate when their respective drivers have completed the tasks requested of them. For example, when a command to turn on and off one of the power devices is provided to the switch's driver, the corresponding state machine ensures that this task is allowed to complete before any new tasks are executed.

Figure 3:
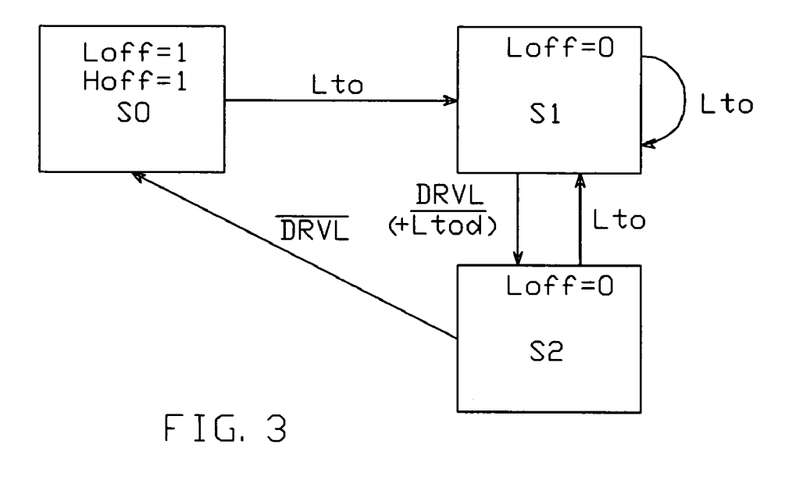
FIG. 3 is a conceptual diagram of a basic state machine as might be employed by the present invention.

At a minimum, high-side state machine HSM receives Hto and DRVH as inputs, while low-side state machine LSM receives Lto and DRVL. A conceptual diagram illustrating the operation of low-side state machine LSM is shown in FIG. 3. Assume that all previously-requested tasks have been completed such that both Hoff and Loff are in their non-lockout states (logic "1")—this is state "S0". State machine LSM remains in state S0 until it detects that driver turn-on signal Lto has toggled to its "on" state. When this occurs, LSM transitions to its S1 state, and lockout signal Loff is set to its lockout state (logic "0"). This puts driver turn-on signal Hto in its "off" state, which in turn puts DRVH and Q1 in their "off" states. DRVH and Q1 will remain off as long as Loff is in its lockout state.

State machine LSM is arranged such that, while in state S1, additional occurrences of Lto cause it to remain in S1. This means that subsequent requests to close Q2 will be ignored until the present task has been completed.

LSM remains in S1 until it detects that low-side driver output signal DRVL has toggled to it "on" state, at which point control transfers to state S2. Loff remains set to "0". LSM is arranged such that, while in state S2, additional occurrences of Lto cause control to revert to S1—again, subsequent requests to close Q2 are ignored until the present task has been completed.

While in state S2, state machine LSM monitors low-side driver output signal DRVL. When it detects that DRVL has toggled to its "off" state, LSM returns to state S0 and sets Loff back to "1"—indicating that the present task has been completed. With Loff set to "1", the high-side driver is allowed to drive Q1 on when so requested by input signal IN.

A typical state machine implementation also preferably includes one or more "timeout" circuits to avoid "stuck" conditions. For example, the low-side driver is allowed to turn on by the HSM after a 'turn-off event' is detected on the high-side. There are valid reasons why this 'event' or transition might not be detected, such as:

- the high-side MOSFET (assuming MOSFET power switches) develops a source-drain short from overheating and burn-out;
- the previous turn-on request to the high-side driver was so short that it never propagated through the high-side driver. The high-side never actually turned on, so a turn-off event will never be detected.

To avoid waiting endlessly for an event that is not coming, at least one of the state machines preferably includes a timeout circuit to provide an escape mechanism. By waiting an appropriately safe amount of time, it can be assumed that all commands that were issued earlier were either never received, or failed in some way.

This mechanism is reflected in the FIG. 3 state diagram with a signal "$\overline{Ltod}$". This signal is based on signal Lto, except that it toggles from "1" to "0" when Lto toggles from "0" to "1", and toggles from "0" to "1" a predetermined amount of time after Lto toggles from "1" to "0". When employed as shown in FIG. 3, state machine LSM transitions from state S1 to S2 if DRVL goes high OR $\overline{Ltod}$ goes high. In this way, the state machine does not remain stuck in S1 if DRVL never toggles. Once in state S2, if DRVL toggles from "1" to "0", or if it has simply remained at "0", control transfers back to state S0.

High-side state machine HSM would typically be implemented in a manner similar to that of LSM, except that its inputs would be Hto and DRVH, and its output would be Hoff. HSM might also employ a timeout circuit as discussed above in relation to LSM.

State machines HSM and LSM could also be arranged to receive additional inputs that could be taken into account when generating Loff and Hoff. For example, in some applications, it is important to know the status of switching node SW. This node may drive, for example, an external inductor, and it may be appropriate for the state machine in control to lock out the opposite state machine until the voltage at node SW has gone to zero. Generally, each lockout signal can be defined as a function of any number of inputs, for example:

Hoff=$f$(Hto, DRVH, node SW, $\overline{Htod}$)

Loff=$f$(Lto, DRVL, node SW, $\overline{Ltod}$)

where "$\overline{Htod}$" is similar to $\overline{Ltod}$, except that it is a delayed version of Hto rather than Lto.

Figure 4:
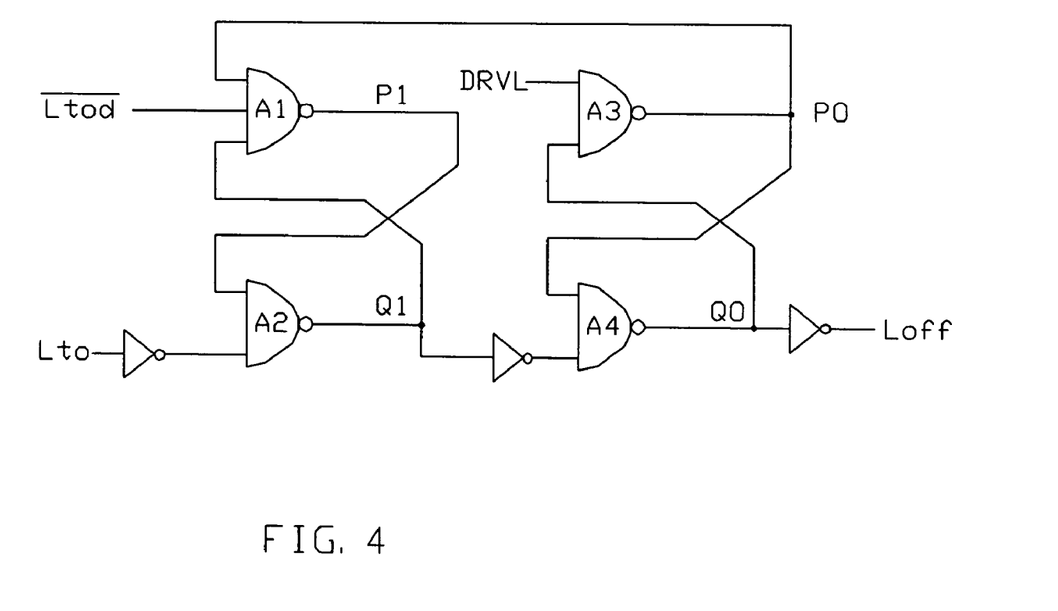
FIG. 4 is a schematic diagram of one possible implementation of a state machine as might be employed by the present invention.

Once the functions to be performed by each state machine are defined, an implementation can be determined. For example, one possible implementation of FIG. 3's low-side state diagram is shown in FIG. 4, which operates as a settable falling-edge detector. Input signals $\overline{Ltod}$, Lto, and DRVL are provided to NAND gates A1, A2 and A3, respectively. The circuit's interconnections establish gates A1 and A2 as a first S-R latch (with $\overline{Ltod}$ connected to the 'reset' input and Lto connected to the 'set' input), and gates A3 and A4 provide a second S-R latch (with DRVL connected to the 'reset' input).

Note that the circuit shown in FIG. 4 is only one possible implementation of the state diagram shown in FIG. 3, and that the state diagram of FIG. 3 is just one possible embodiment of a low-side state machine in accordance with the present invention. It is only essential that respective state machines be connected across the inputs and outputs of the high-side and low-side driver circuits, and that the state machines be arranged to prevent cross-conduction between the power devices being driven.

Figure 5:
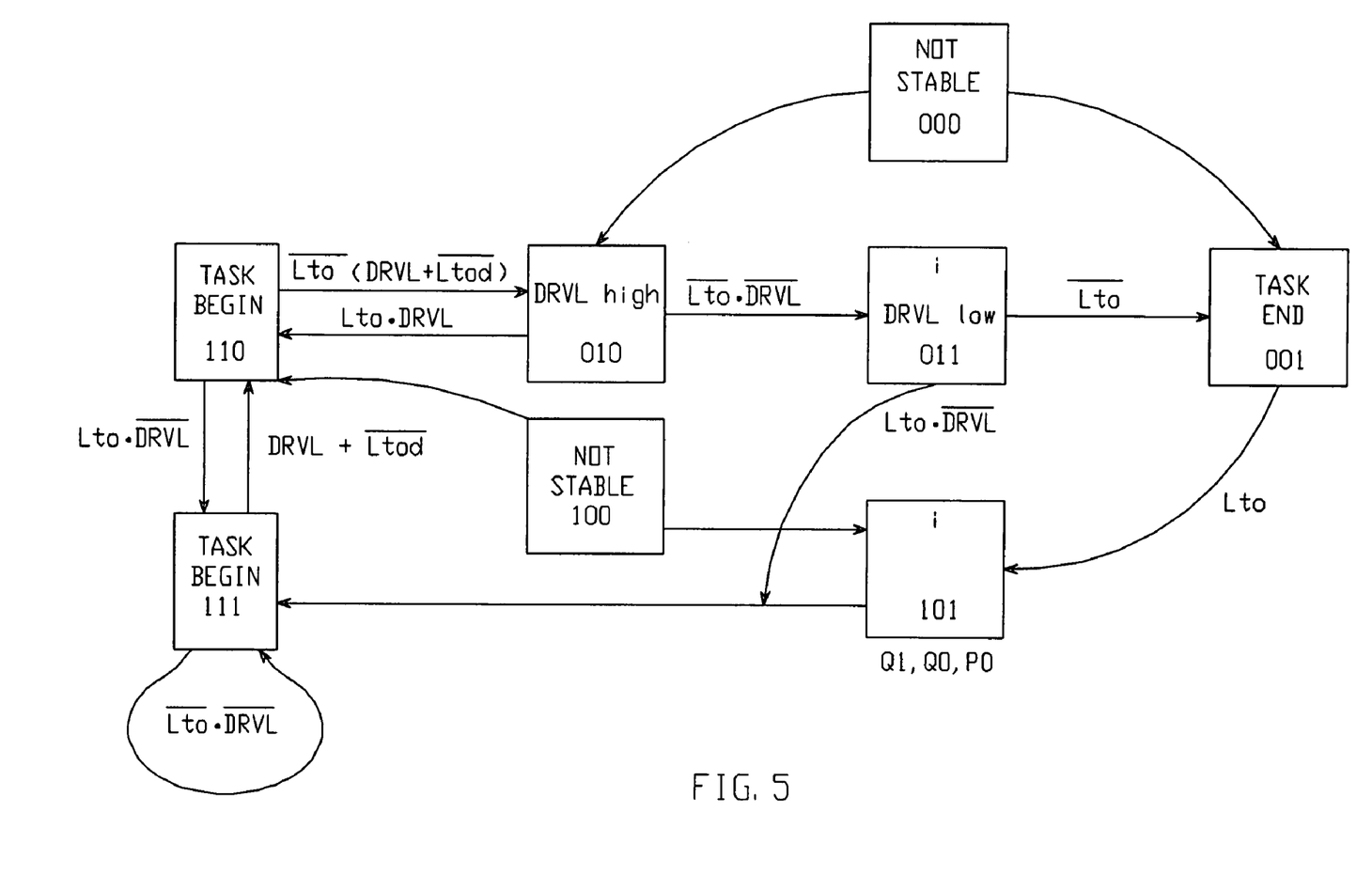
FIG. 5 is a full state diagram for a state machine as might be employed by the present invention.

A full state diagram corresponding to FIG. 4's low-side state machine, which includes intermediate states (indicated with an "i"), is shown in FIG. 5. Each state is labeled with three binary values, which correspond to outputs Q1, Q0, P0 of the low-side state machine shown in FIG. 4.

Figure 6A:
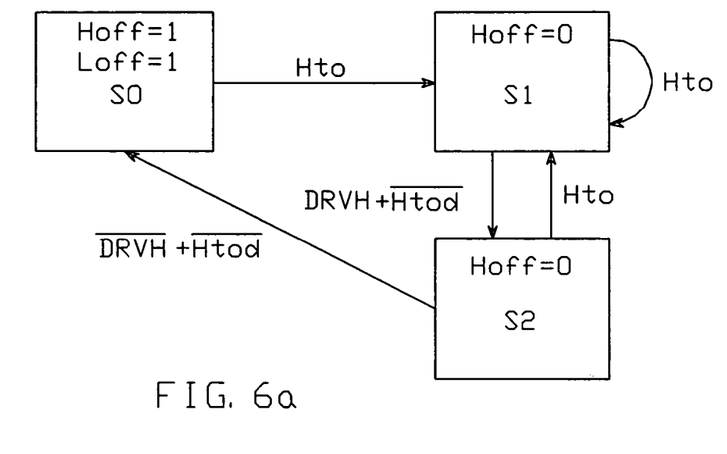
FIG. 6*a* is a conceptual diagram of another basic state machine as might be employed by the present invention.
Figure 6B:
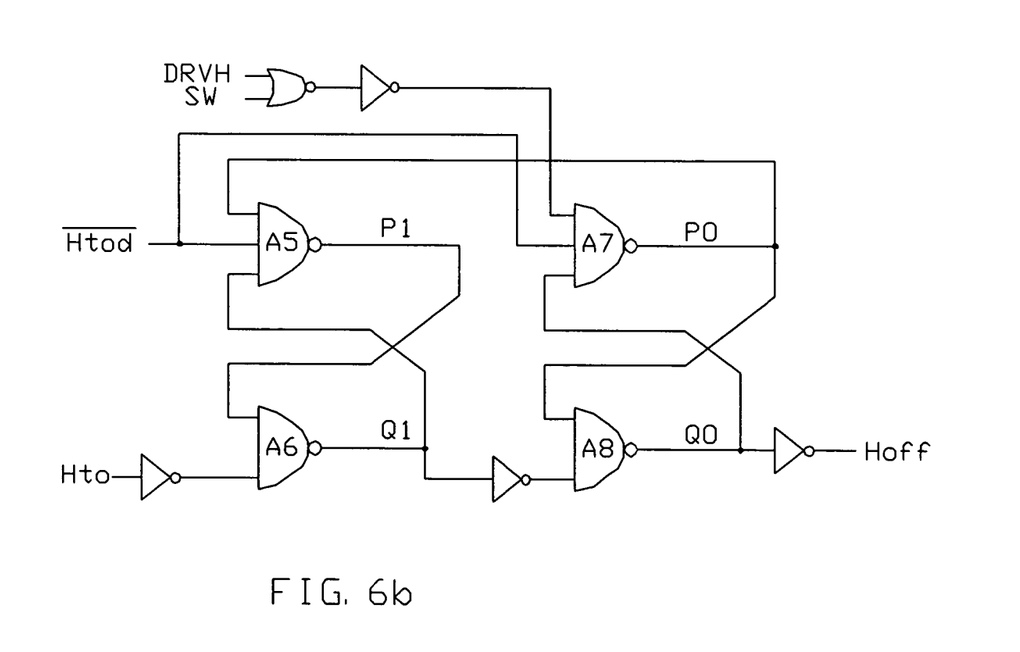
FIG. 6*b* is a schematic diagram of another possible implementation of a state machine as might be employed by the present invention.
Figure 6C:
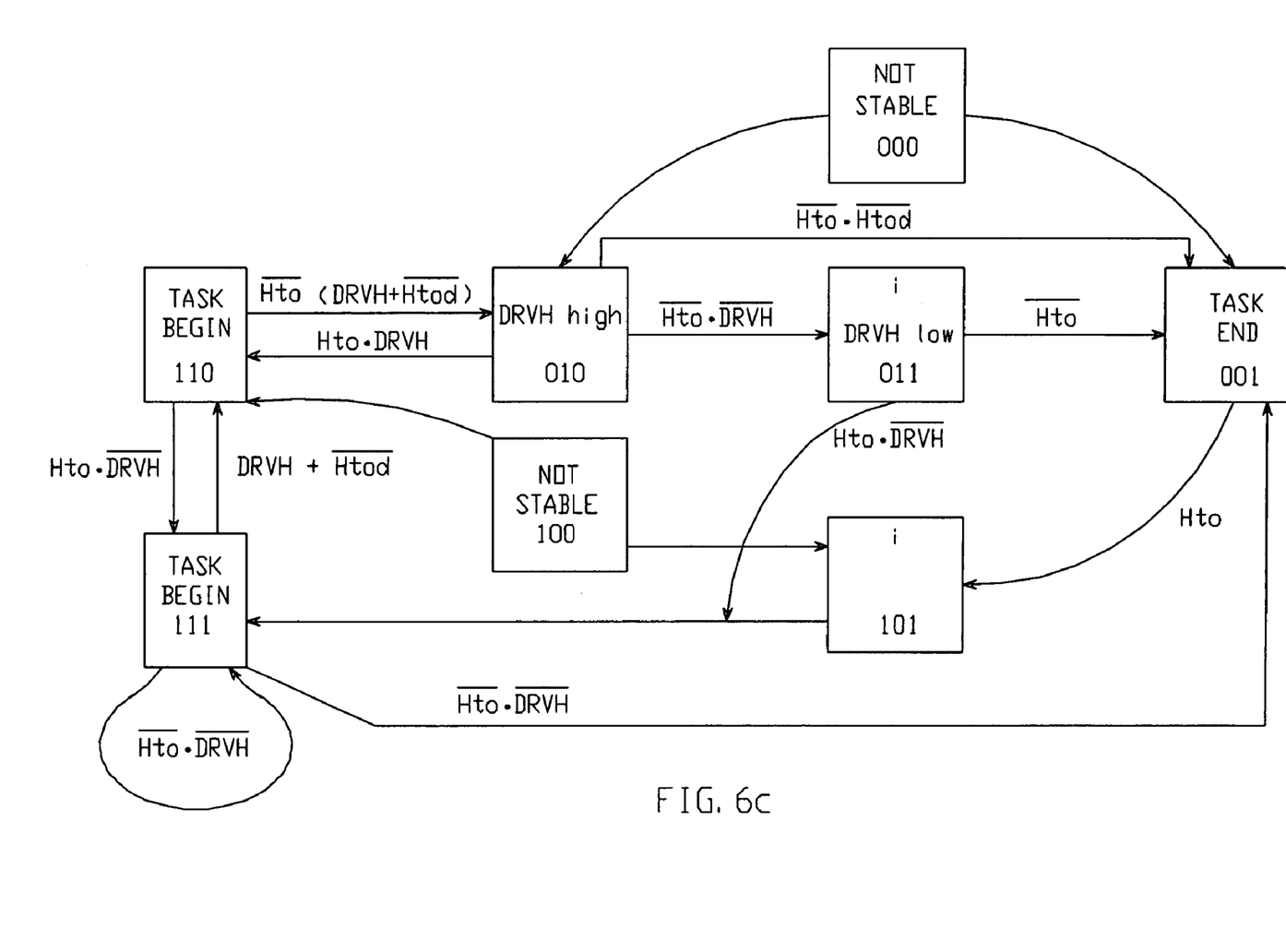
FIG. 6*c* is a full state diagram for a state machine as might be employed by the present invention.

One possible state diagram for high-side state machine HSM is shown in FIG. 6a, a possible implementation of the high-side state diagram is shown in FIG. 6b, and a full state diagram corresponding to the FIG. 6a implementation is shown in FIG. 6c. These diagrams are very similar to the low-side diagrams shown in FIGS. 3–5, except that here, the timeout signal is arranged to override both Hto and DRVH, such that it indicates completion of task regardless of the driver state. This is seen in FIG. 6a with the use of signal $\overline{Htod}$, which goes high a predetermined time delay after high-side driver turn-on signal Hto falls. An occurrence of $\overline{Htod}$ takes the state machine from state S1 to S2, and/or from state S2 back to S0.

FIG. 6b illustrates a slightly different implementation than was shown in FIG. 4. Input signals $\overline{Htod}$ and Hto are provided to NAND gates A5 and A6, respectively. Here, however, signal DRVH is NOR'ed with the signal at switching node SW before being provided to NAND gate A7. The circuit's interconnections establish gates A5 and A6 as a first S-R latch (with $\overline{Htod}$ connected to the 'reset' input and Hto connected to the 'set' input), and gates A7 and A8 provide a second S-R latch (with DRVH+SW connected to the 'reset' input). The connection of $\overline{Htod}$ to A7 implements the timeout override function discussed above.

The high-side full state diagram shown in FIG. 6c is similar to the low-side full state diagram shown in FIG. 5, except for the implementation of the timeout override function discussed above.

Figure 7:
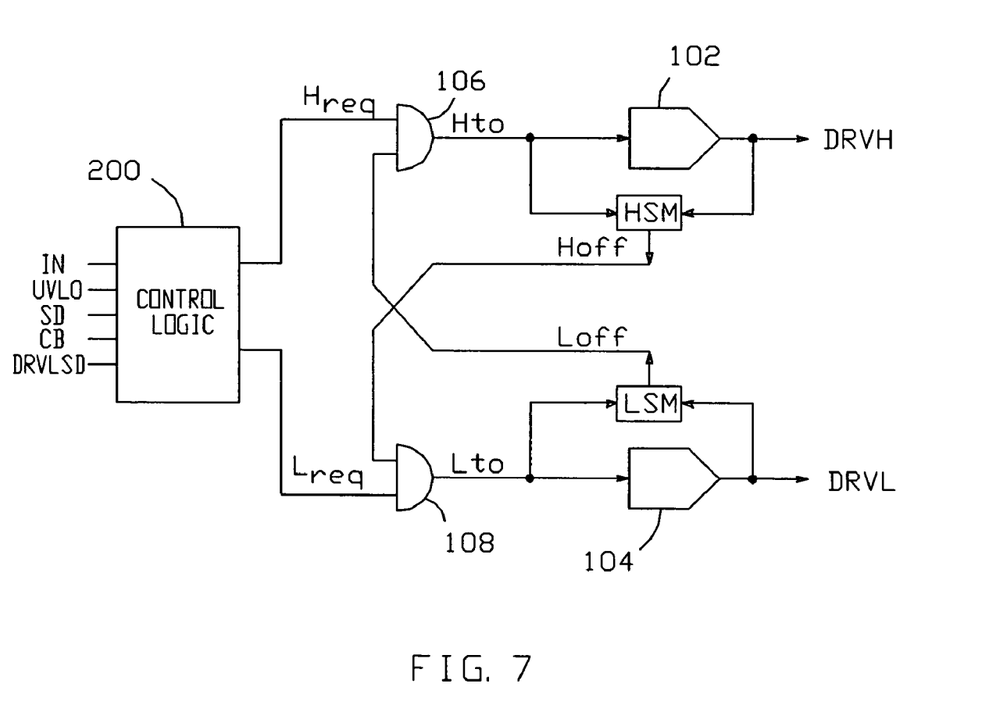
FIG. 7 is a block/schematic diagram of a driver control system which employs the principles of the present invention.

One possible embodiment of a complete driver control system is shown in FIG. 7. The system might include a control logic block 200 which receives a number of different inputs and produces outputs to logic gates 106 and 108. Inputs to block 200 might include, for example, input signal IN, an undervoltage lockout signal (UVLO), a shutdown signal (SD), a crowbar signal (CB), and a low-side driver shutdown signal (DRVLSD). Once a system's inputs and their functions are defined, steady-state Boolean equations can be derived for driver turn-on signals Hto and Lto. For example, the output $L_{req}$ of control logic block 200 provided to low side logic gate 108 might be given by:

$$L_{req} = \overline{IN} \cdot SD \cdot UVLO + CB,$$

and the control logic block output $H_{req}$ provided to high side logic gate 106 might be given by:

$$H_{req} = IN \cdot SD \cdot UVLO \cdot DRVLSD \cdot \overline{CB}$$

Signals $L_{req}$ and $H_{req}$ are normally complementary—i.e., they may or may not be race-free.

The system's operation is completely defined by adding lockout signals Hoff and Loff to the equations as follows:

$$Lto = Hoff \cdot L_{req}, \text{ and}$$

$$Hto = Loff \cdot H_{req})$$

Control logic block 200 typically comprises basic combinational logic, arranged to realize basic Boolean equations for $L_{req}$ and $H_{req}$ based on the input terms. These equations can be of any desired combination and will not cause cross-conduction, even if those equations have glitches. For example, the simplest combinational logic is shown in FIG. 2, where IN and $\overline{\text{IN}}$ serve as terms "$H_{req}$" and "$L_{req}$", respectively. Naturally, $\overline{\text{IN}}$ is always a delayed version of IN. When IN goes from 0 to 1, $H_{req}$ goes high before $L_{req}$ goes low, but the present invention's state machines lock out that race condition.

Note that the inputs and equations shown above are merely exemplary. The actual inputs provided and the equations defining Hto and Lto depend on the specific application.

While particular embodiments of the invention have been shown and described, numerous variations and alternate embodiments will occur to those skilled in the art. Accordingly, it is intended that the invention be limited only in terms of the appended claims.

I claim:

1. An anti-cross conduction driver control circuit, comprising:
    first and second normally complementary input signals, each of which has on and off states;
    first and second lockout signals which have lockout and non-lockout states;
    a first driver turn-on signal having on and off states, said first driver turn-on signal being in its on state when said first input signal is in its on state and said first lockout signal is in its non-lockout state;
    a second driver turn-on signal having on and off states, said second driver turn-on signal being in its on state when said second input signal is in its on state and said second lockout signal is in its non-lockout state;
    first and second driver circuits which receive said first and second driver turn-on signals at respective inputs and which produce first and second driver circuit outputs which have on and off states at respective outputs which track said first and second driver turn-on signals, said first and second driver circuit outputs, when in their on state, suitable for actuating first and second power devices which conduct respective currents when actuated;
    a first state machine which receives said first driver turn-on signal and said first driver circuit output at respective inputs and which provides said second lockout signal at an output, said first state machine arranged to toggle said second lockout signal from its non-lockout state to its lockout state when said first driver turn-on signal toggles from its off state to its on state, and to toggle said second lockout signal from its lockout state to its non-lockout state when said first driver circuit output toggles from its on state to its off state; and
    a second state machine which receives said second driver turn-on signal and said second driver circuit output at respective inputs and which provides said first lockout signal at an output, said second state machine arranged to toggle said first lockout signal from its non-lockout state to its lockout state when said second driver turn-on signal toggles from its off state to its on state, and to toggle said first lockout signal from its lockout state to its non-lockout state when said second driver circuit output toggles from its on state to its off state; such that said first and second driver circuit outputs are prevented from being in their on states simultaneously.

2. An anti-cross conduction driver control circuit, comprising:
    first and second normally complementary input signals, each of which has on and off states;
    a first logic gate connected to receive said first input signal and a first lockout signal at respective inputs and arranged to provide a first driver turn-on signal having on and off states, said first lockout signal having lockout and non-lockout states, said first logic gate arranged to set said first driver turn-on signal to its on state when said first lockout signal is in its non-lockout state and said first input signal is in its on state, and to set said first driver turn-on signal to its off state otherwise;
    a second logic gate connected to receive said second input signal and a second lockout signal at respective inputs and arranged to provide a second driver turn-on signal having on and off states, said second lockout signal having lockout and non-lockout states, said second logic gate arranged to set said second driver turn-on signal to its on state when said second lockout signal is in its non-lockout state and said second input signal is in its on state, and to set said second driver turn-on signal to its off state otherwise;
    a first driver circuit having an input connected to receive said first driver turn-on signal and an output having on and off states, said first driver circuit output tracking said first driver turn on signal, said first driver circuit output, when in said on state, suitable for actuating a first power device which conducts a current when actuated;
    a second driver circuit having an input connected to receive said second driver turn on signal and an output having on and off states, said second driver circuit output tracking said second driver turn-on signal, said second driver circuit output, when in said on state, suitable for actuating a second power device which conducts a current when actuated;
    a first state machine which receives said first driver turn-on signal and said first driver circuit output at respective inputs and which provides said second lockout signal at an output, said first state machine arranged to toggle said second lockout signal from its non-lockout state to its lockout state when said first driver turn-on signal toggles from its off state to its on state, and to toggle said second lockout signal from its lockout state to its non-lockout state when said first driver circuit output toggles from its on state to its off state, and
    a second state machine which receives said second driver turn-on signal and said second driver circuit output at respective inputs and which provides said first lockout signal at an output, said second state machine arranged to toggle said first lockout signal from its non-lockout state to its lockout state when said second driver turn-on signal toggles from its off state to its on state, and to toggle said first lockout signal from its lockout state to its non-lockout state when said second driver circuit output toggles from its on state to its off state, such that said first and second driver circuit outputs are prevented from being in their on states simultaneously.

3. The control circuit of claim 2, wherein said logic gates are AND gates and said on and off states are "high" and "low" logic levels, respectively.

4. The control circuit of claim 2, wherein said first state machine is further arranged to require that said first driver circuit output toggle from its off state to its on state before toggling to its off state prior to toggling said second lockout signal from its lockout state to its non-lockout state, and said second state machine is further arranged to require that said second driver circuit output toggle from its off state to its on state before toggling to its off state prior to toggling said first lockout signal from its lockout state to its non-lockout state.

5. The control circuit of claim 2, wherein said first and second power devices are field-effect transistors having their drain-source circuits connected in series.

6. The control circuit of claim 2, wherein each of said state machines is arranged to:
transfer from a first state (S0) in which said state machine's lockout signal is in said non-lockout state to a second state (S1) in which said lockout signal is in said lockout state when the driver turn-on signal provided to said state machine toggles from off to on;
transfer from said second state (S1) to a third state (S2) in which said lockout signal is in said lockout state when the driver circuit output provided to said state machine toggles from off to on; and
transfer from said third state (S2) to said first state (S0) when the driver circuit output provided to said state machine toggles from on to off, thereby toggling said lockout signal from its lockout state to its non-lockout state.

7. The control circuit of claim 6, wherein each of said state machines is further arranged to:
remain in said second state (S1) if the driver turn-on signal provided to said state machine toggles from off to on while said state machine is in said second state (S1); and
transfer from said third state (S2) to said second state (S1) if the driver turn-on signal provided to said state machine toggles from off to on while said state machine is in said third state (S2).

8. The control circuit of claim 6, wherein at least one of said state machines is further arranged to:
generate a timeout signal which toggles from on to off when said driver turn-on signal provided to said state machine toggles from off to on and toggles from off to on a predetermined time period after said driver turn-on signal provided to said state machine toggles from on to off,
said state machine arranged to transfer from said second state (S1) to said third state (S2) when said timeout signal toggles from off to on or when the driver circuit output provided to said state machine toggles from off to on.

9. The control circuit of claim 6, further comprising control logic which receives a plurality of input terms, and outputs said first and second normally complementary input signals based on said input terms.

10. An anti-cross conduction driver control circuit, comprising:
first and second power devices which conduct respective currents when actuated in response to first (DRVH) and second (DRVL) driver circuit outputs, respectively;
control logic which receives a plurality of input terms and which outputs a first input signal (IN) which attains a "high" logic level when said first power device is to be actuated and a "low" logic level otherwise, and a second input signal ($\overline{IN}$) which is normally complementary to said first input signal (IN) which attains a "high" logic level when said second power device is to be actuated and a "low" logic level otherwise;
a first AND gate connected to receive said first input signal (IN) and a first lockout signal (Loff), each having "low" and "high" logic states, at respective inputs and arranged to provide a first driver turn-on signal (Hto) wherein Hto=IN·Loff;
a second AND gate connected to receive said second input signal ($\overline{IN}$) and a second lockout signal (Hoff), each having "low" and "high" logic states, at respective inputs and arranged to provide a second driver turn-on signal (Lto) wherein Lto=$\overline{IN}$·Hoff;
a first driver circuit having an input connected to receive said first driver turn-on signal (Hto), and to provide said first driver circuit output (DRVH) such that DRVH tracks said first driver turn-on signal (Hto), said DRVH output, when "high", actuating said first power device;
a second driver circuit having an input connected to receive said second driver turn on signal (Lto), and to provide said second driver circuit output (DRVL) such that DRVL tracks said second driver turn-on signal (Lto), said DRVL output, when "high", actuating said second power device;
a first state machine which receives said first driver turn-on signal (Hto) and said first driver circuit output (DRVH) at respective inputs and which provides said second lockout signal (Hoff) at an output, said first state machine arranged to toggle said second lockout signal (Hoff) from "high" to "low" when said first driver turn-on signal (Hto) toggles from "low" to "high", and to toggle said second lockout signal (Hoff) from "low" to "high" when said first driver circuit output (DRVH) toggles from "high" to "low", and
a second state machine which receives said second driver turn-on signal (Lto) and said second driver circuit output (DRVL) at respective inputs and which provides said first lockout signal (Loff) at an output, said second state machine arranged to toggle said first lockout signal (Loff) from "high" to "low" when said second driver turn-on signal (Lto) toggles from "low" to "high", and to toggle said first lockout signal (Loff) from "low" to "high" when said second driver circuit output (DRVL) toggles from "high" to "low",
such that said first driver circuit output (DRVH) and said second driver circuit output (DRVL) are prevented from being "high" simultaneously, thereby preventing said first and second power devices from being actuated simultaneously.

11. The control circuit of claim 10, wherein said first and second power devices are field-effect transistors having their drain-source circuits connected in series.

12. The control circuit of claim 10, wherein each of said state machines is arranged to:
transfer from a first state (S0) in which said state machine's lockout signal is "high" to a second state (S1) in which said lockout signal is "low" when the driver turn-on signal provided to said state machine toggles from "low" to "high";
transfer from said second state (S1) to a third state (S2) in which said lockout signal is "low" when the driver circuit output provided to said state machine toggles from "low" to "high";
transfer from said third state (S2) to said first state (S0) when the driver circuit output provided to said state machine toggles from "high" to "low", thereby toggling said lockout signal from "low" to "high";
remain in said second state (S1) if the driver turn-on signal provided to said state machine toggles from "low" to "high" while said state machine is in said second state (S1); and transfer from said third state (S2) to said second state (S1) if the driver turn-on signal provided to said state machine toggles from "low" to "high" while said state machine is in said third state (S2).

13. The control circuit of claim 12, wherein at least one of said state machines is further arranged to:

generate a timeout signal $\overline{tod}$ which toggles from "high" to "low" when said driver turn on signal provided to said state machine toggles from "low" to "high", and toggles from "low" to "high" a predetermined time period after said driver turn-on signal provided to said state machine toggles from "high" to "low", said state machine arranged to transfer from said second state (S1) to said third state (S2) when said timeout signal $\overline{tod}$ toggles from "low" to "high" or when the driver circuit output provided to said state machine toggles from "low" to "high".

14. The control circuit of claim 12, wherein said second state machine comprises:

a first logic gate arranged to produce an output $Q1=\overline{Lto \cdot P1}$;

a second logic gate arranged to produce an output $Q0=\overline{Q1 \cdot P0}$;

a third logic gate arranged to produce an output $P0=\overline{DRVL \cdot Q0}$; and a fourth logic gate arranged to produce an output $P1=\overline{tod \cdot P0 \cdot Q1}$;

said output $Q0=\overline{Loff}$.

15. The control circuit of claim 10, wherein said first state machine is further arranged to require that said first driver circuit output (DRVH) toggle from "low" to "high" before toggling from "high" to "low" prior to toggling said second lockout signal (Hoff) from "low" to "high", and said second state machine is further arranged to require that said second driver circuit output (DRVL) toggle from "low" to "high" before toggling from "high" to "low" prior to toggling said first lockout signal (Loff) from "low" to "high".

16. A method of preventing cross-conduction between first and second series-connected power devices which conduct respective currents when actuated in response to first and second drive signals, respectively, which are in turn responsive to first and second input signals having on and off states and which are normally complementary, comprising:

gating said first input signal with a first lockout signal;

buffering said gated first input signal such that it tracks said gated first input signal, said buffered gated first input signal having on and off states and being said first drive signal, said first drive signal suitable for actuating said first power device when in said on state;

gating said second input signal, which is normally complementary to said first input signal, with a second lockout signal;

buffering said gated second input signal such that it tracks said gated second input signal, said buffered gated second input signal having on and off states and being said second drive signal, said second drive signal suitable for actuating said second power device when in said on state;

monitoring said gated first input signal and said first drive signal;

setting said second lockout signal to allow said second input signal to pass when said first drive signal toggles from said on state to said off state and setting said second lockout signal to block said second input signal when said gated first input signal toggles from said off state to said on state;

monitoring said gated second input signal and said second drive signal; and setting said first lockout signal to block said first input signal when said gated second input signal toggles from said off state to said on state and setting said first lockout signal to allow said first input signal to pass when said second drive signal toggles from said on state to said off state;

such that said first and second drive signals are prevented from being in their on states simultaneously.

17. The method of claim 16, wherein said step of setting said first lockout signal to allow said first input signal to pass further requires first detecting that said second drive signal has toggled from said off state to said on state prior to its toggling to said off state.

18. The method of claim 16, wherein said step of setting said first lockout signal to allow said first input signal to pass further requires first detecting that said second drive signal has toggled from said off state to said on state prior to its toggling to said off state, and said step of setting said second lockout signal to allow said second input signal to pass further requires first detecting that said first drive signal has toggled from said off state to said on state prior to its toggling to said off state.

* * * * *